United States Patent
Kameda

(10) Patent No.: US 6,552,390 B2
(45) Date of Patent: Apr. 22, 2003

(54) SEMICONDUCTOR DEVICE

(75) Inventor: Mitsuhiro Kameda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/174,999

(22) Filed: Jun. 20, 2002

(65) Prior Publication Data

US 2002/0195640 A1 Dec. 26, 2002

(30) Foreign Application Priority Data

Jun. 20, 2001 (JP) ........................................ 2001-186606

(51) Int. Cl.[7] ............................................. H01L 29/76
(52) U.S. Cl. ........................ 257/335; 257/343; 257/336
(58) Field of Search ................................ 257/335–336, 257/342–347, 324–329, 350, 351; 438/301

(56) References Cited

U.S. PATENT DOCUMENTS

| | | | |
|---|---|---|---|
| 4,811,065 A | | 3/1989 | Cogan |
| 5,925,910 A | | 7/1999 | Menegoli |
| 6,025,237 A | * | 2/2000 | Choi ........................... 438/301 |
| 6,064,086 A | * | 5/2000 | Nakagawa et al. .......... 257/335 |
| 6,472,709 B1 | * | 10/2002 | Blanchard ................... 257/343 |

FOREIGN PATENT DOCUMENTS

| | | | | |
|---|---|---|---|---|
| JP | 05-90400 | * | 4/1993 | ........... H01L/21/76 |
| JP | 8-130249 | | 5/1996 | |
| JP | 10-284731 | | 10/1998 | |

OTHER PUBLICATIONS

Terashima et al., 60V Field NMOS and PMOS transistors for the multi-voltage system integration, Proceedings of 2001 International Symposium on Power Semiconductor Devices &ICS, pp. 259–262.*

Malay Trivedi, et al. "Comparison of RF Performance of Vertical and Lateral DMOSFET," Proc. of the 11th International Symposium on Power Semiconductor Devices and ICs. 1999, pp. 245–248.

Shuming Xu, et al. "RF LDMOS with Extreme Low Parasitic Feedback Capacitance and High Hot–Carrier Immunity." Tech. Dig. International Electron Devices Meeting, 1999, pp. 201–204.

Isao Yashida, et al. "Highly Efficient 1.5 GHz Si Power Mosfet for Ditical Cellular Front End." Proceedings of 1992 International Sumposium on Power Semiconductor Devices and ICs, 1999, pp. 156–157.

* cited by examiner

*Primary Examiner*—Wael Fahmy
*Assistant Examiner*—(Vikki) Hoa B. Trinh
(74) *Attorney, Agent, or Firm*—Oblon, Spivak, McClelland, Maier & Neustadt, P.C.

(57) ABSTRACT

A semiconductor device comprises a first conductivity type semiconductor substrate, a first conductivity type semiconductor layer formed on the substrate, a MISFET formed in a first area of the semiconductor layer, having a drain and source, and a gate electrode formed on a semiconductor layer between the drain and source through a gate insulator, an internal source electrode formed to contact the source and whose surface is covered with an insulating layer, a diode formed in a second area of the semiconductor layer, having a cathode and an anode provided on the cathode, an anode electrode which contacts the anode, a conductive portion piercing the semiconductor layer to electrically connect the internal source electrode and the cathode to the substrate, and a source/cathode electrode formed on the back plane of the substrate and commonly provided as a source electrode of the MISFET and a cathode electrode of the diode.

20 Claims, 8 Drawing Sheets

SEMICONDUCTOR DEVICE

CROSS-REFERENCE TO RELATED APPLICATIONS

This application is based upon and claims the benefit of priority from the prior Japanese Patent Application No. 2001-186606, filed Jun. 20, 2001, the entire contents of which are incorporated herein by reference.

BACKGROUND OF THE INVENTION

1. Field of the Invention

The present invention relates to a semiconductor device, and more particularly to a power semiconductor device having a MISFET (metal insulator semiconductor field effect transistor) and a rectifying element mounted on the same semiconductor chip, and a semiconductor device for use in, e.g., a direct-current switch or a DC—DC converter.

2. Description of the Related Art

As a power MISFET (MOSFET), there is known an FET having a double diffusion type lateral structure, a P-channel type FET (PMOSFET) having an LDD (lightly-doped drain) structure or an N-channel type FET (NMOSFET), for example. The performance of these FETs is improved (reducing losses) by adopting the structure that a plurality of FET cells are aligned on a semiconductor substrate.

As an example of use of the power MOSFET, there is a direct-current switch which is inserted in a drive current supply path between a direct-current supply and a load (for example, a motor or an LSI).

FIG. 1 shows an example of the circuit connection using a direct-current switch constituted by connecting a conventional PMOSFET and a reverse current preventing diode in series.

In this circuit, a diode is inserted in the forward direction between the direct-current supply 81 and the load 82, and a source and a drain of the PMOSFET 84 are inserted in series. In this case, as a diode, there is usually used a Schottky barrier diode (SBD) 83 which has the high-speed responsibility and whose voltage drop and steady loss is small.

It is to be noted that a parasitic PN junction diode 85 exists in the reverse direction between the drain and source of the PMOSFET 84. Further, a battery 86 is connected to the load 82 in parallel.

In the circuit illustrated in FIG. 1, a pulse signal for switching control is applied between a gate of the PMOSFET 84 and the ground potential GND. When the PMOSFET 84 is controlled in the ON state, a drive current is supplied from the direct-current supply 81 toward the load 82 through the part between an anode and a cathode of the SBD 83 and the PMOSFET 84. In this period, the battery 86 is charged.

Then, in the OFF period of the PMOSFET 84, when the reverse current starts to flow from the battery 86 toward the direct-current supply 81 through the parasitic PN junction diode 85 of the PMOSFET 84, the reverse junction between the cathode and the anode of the SBD 83 avoids the reverse current.

Meanwhile, when assembling a product in which the PMOSFET 84 and the SBD 83 are formed on different chips and accommodated in different packages, there is a problem that the degree of freedom in development and design is restricted in terms of a packaging area (occupied space) or the like.

Furthermore, when the PMOSFET 84 and the SBD 83 are formed on different chips and mounted on a lead frame in the electrically insulated state, the source of the PMOSFET 84 and the cathode of the SBD 83 must be connected by using external wirings (for example, they are connected to the lead frame by using wire bonding), which leads to a problem that the resistance component or the inductance component of the entire circuit increases.

Moreover, FIG. 2 shows a conventional DC—DC converter of a synchronous rectification type which is constituted by using an NMOSFET and a diode. In this circuit, although the NMOSFET 91 and the diode 92 are connected in parallel, an SBD is usually likewise used for the diode in this case. In FIG. 2, it is to be noted that reference numeral 93 denotes an NMOSFET for switching and 94 designates a control IC (integrated circuit) which controls the NMOSFET 91 and the element 93.

Meanwhile, when assembling a product in which the NMOSFET 91 (or 93) and the SBD 92 are formed on different chips and accommodated in different packages, the cost, the packaging area or the like is restricted. When they are formed on different chips and packaged on the lead frame in the electrically insulated state, there is a problem similar to that in the prior art circuit of FIG. 1, namely, the resistance component or the inductance component of the entire circuit increases due to the external wiring.

As described above, the prior art semiconductor device having the MOSFET and the SBD connected in series by using the external wiring has a problem that the cost, the packaging area and the resistance component or the inductance component of the wiring increase.

Therefore, in the semiconductor device having the FET and the diode mounted on the same chip, there has been long-awaited a semiconductor device which can eliminate the need of connecting the source area of the FET and the cathode of the diode through the external wirings and reduce the cost, the packaging area, and the resistance component or the inductance component of the wirings.

BRIEF SUMMARY OF THE INVENTION

According to a first aspect of the present invention, there is provided a semiconductor device comprising:

a first conductivity type semiconductor substrate having a first and a second main plane:

a first conductivity type semiconductor layer formed on the first main plane of the semiconductor substrate;

a MISFET formed in a first surface area of the semiconductor layer, the MISFET having a drain region and a source region selectively formed on the semiconductor layer, and a gate electrode formed on the semiconductor layer between the drain region and the source region through a gate insulator;

an internal source electrode formed so as to contact the source region on a top of the semiconductor layer and whose surface is covered with an insulating layer;

a diode formed in a second surface area of the semiconductor layer, the diode having a cathode region provided in the semiconductor layer and an anode region provided on the cathode region;

an anode electrode formed above the semiconductor layer and contacts the anode region of the diode;

a conductive portion which pierces the semiconductor layer so as to electrically connect the internal source electrode of the MISFET and the cathode region of the diode to the semiconductor substrate; and a source/cathode electrode formed on the second main plane of the semiconductor substrate and commonly provided as a source electrode of the MISFET and a cathode electrode of the diode.

According to a second aspect of the present invention, there is provided a semiconductor device comprising:

a first conductivity type semiconductor substrate having a first and a second main plane;

a first conductivity type semiconductor layer formed on the first main plane of the semiconductor substrate;

a plurality of MISFETs formed in a first surface area of the semiconductor layer, each of the plurality of MISFETs having a drain region and a source region selectively formed on the semiconductor layer, and a gate electrode formed on the semiconductor layer between the drain region and the source region through a gate insulator;

an internal drain electrode formed so as to contact the drain region on the semiconductor layer;

an internal source electrode formed so as to contact the source region on the semiconductor layer;

a diode formed in the second surface area of the semiconductor layer, the diode having a cathode region provided in the semiconductor layer and an anode region provided on the cathode region;

an anode electrode formed above the semiconductor layer and contacts the anode region of the diode;

an interlayer insulator formed on the first semiconductor layer so as to cover the first surface area and the second surface area while exposing the anode electrode;

a surface drain electrode formed on the interlayer insulator above the first surface area and connected to the internal drain electrode of each of the plurality of MISFETs;

a conductive portion which pierces the semiconductor layer so as to electrically connect the internal source electrode of the MISFET and the cathode area of the diode; and a source/cathode electrode formed on the second main plane of the semiconductor substrate and commonly provided as a source electrode of the plurality of MISFETs and a cathode electrode of the diode.

According to a third aspect of the present invention, there is provided a semiconductor device comprising:

a first conductivity type semiconductor substrate having a first and a second main plane;

a first conductivity type semiconductor layer formed on the first main plane of the semiconductor substrate;

a plurality of MISFETs formed in the semiconductor layer, each of the plurality of MISFETs having a drain region and a source region selectively formed on the semiconductor layer, and a gate electrode formed on the semiconductor layer between the drain region and the source region through a gate insulator;

an internal drain electrode formed so as to contact the drain region on the semiconductor layer;

an internal source electrode formed so as to contact the source region on the semiconductor layer;

a plurality of diodes formed in areas between the plurality of MISFETs on the semiconductor layer, each of the plurality of diodes having a cathode region provided in the semiconductor layer and an anode region provided on the cathode region;

a plurality of internal anode electrodes formed above the semiconductor layer and contact the anode region of each of the plurality of diodes;

an interlayer insulator formed on the first semiconductor layer;

a surface drain electrode formed on the interlayer insulator and connected to the internal drain electrode of each of the plurality of MISFETs;

a surface anode electrode formed on the interlayer insulator and connected to the plurality of internal anode electrodes;

a plurality of conductive portions which pierce the semiconductor layer so as to electrically connect the internal source electrode of each of the plurality of MISFETs and the cathode region of each of the plurality of diodes to the semiconductor substrate; and a source/cathode electrode formed on the second main plane of the semiconductor substrate and commonly provided as a source electrode of the plurality of MISFETs and a cathode electrode of the plurality of diodes.

BRIEF DESCRIPTION OF THE SEVERAL VIEW OF THE DRAWING

Figure 11:
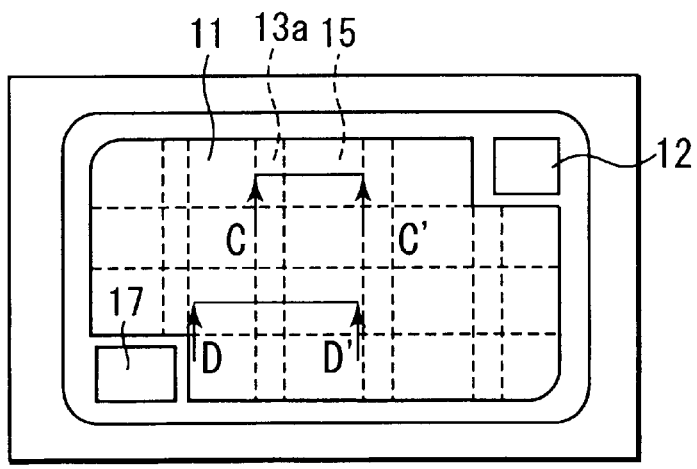
FIG. 11 is a top plan view showing a pattern layout of the semiconductor device according to a fifth embodiment of the present invention.
Figure 14:
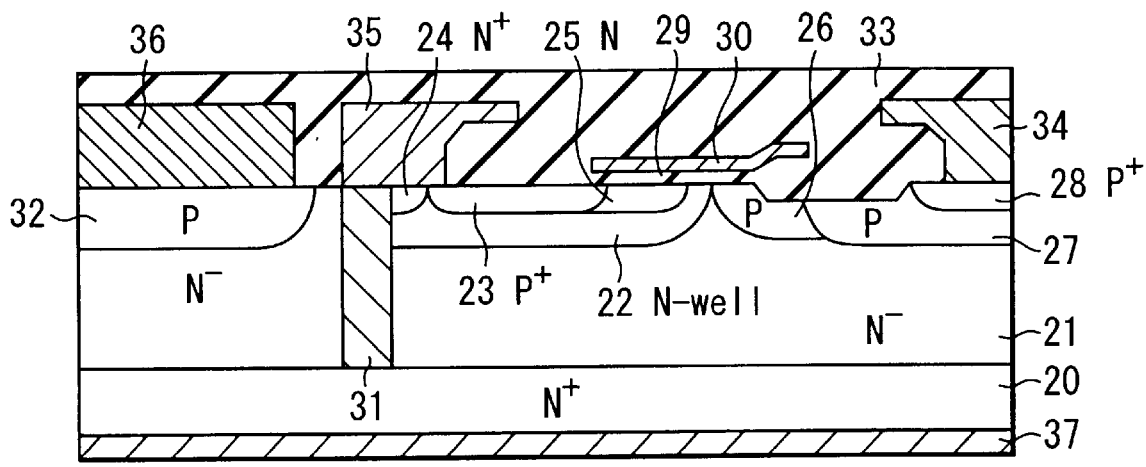
Figure 13A:
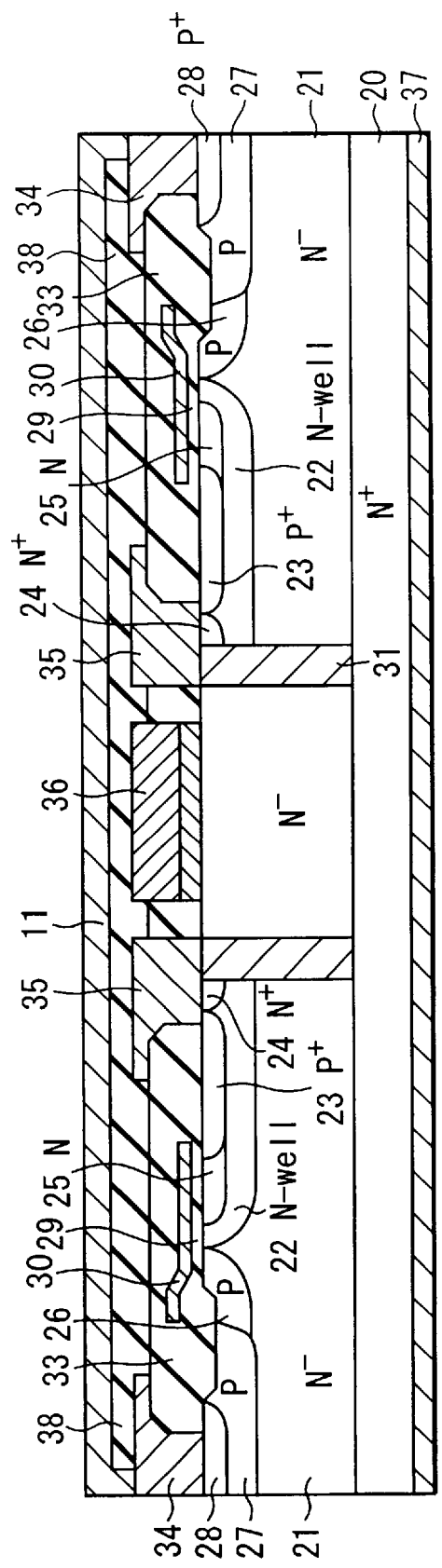
FIG. 13A is a cross-sectional view of the semiconductor device according to the fifth embodiment taken along the line D-D' in FIG. 11 and schematically shows two cells of an NMOSFET having a double diffusion lateral structure and a structure of an SBD formed on an N⁺/N⁻ substrate.
Figure 13B:
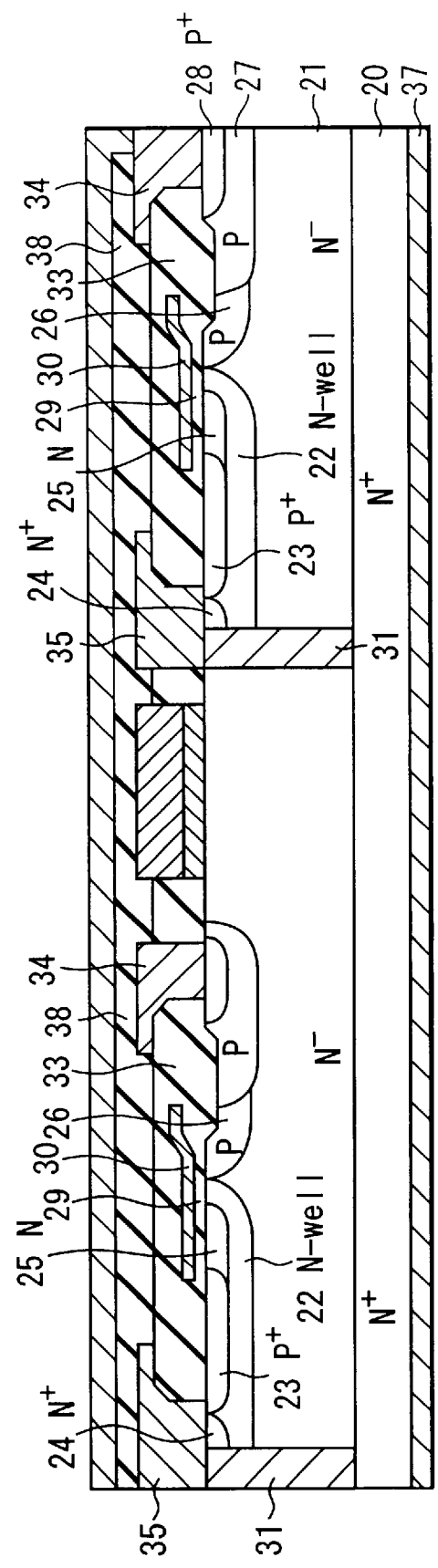

FIG. 13B is a cross-sectional view of another structure of the semiconductor device according to the fifth embodiment taken along the line D-D' in FIG. 11 and schematically shows two cells of an NMOSFET having a double diffusion type lateral structure and a structure of an SBD formed on an N⁺/N⁻ substrate; and FIG. 14 is a cross-sectional view of a modification of the first embodiment when a regular diode is used instead of the SBD.

DETAILED DESCRIPTION OF THE INVENTION

Usually, a lateral MOSFET is formed on a semiconductor substrate (wafer) having an epitaxially grown semiconductor layer and then separated on a chip. Both a source and a drain of the lateral MOSFET are formed on the epitaxial semiconductor layer side.

The present invention intends to reduce the cost, the packaging area and the resistance component or the inductance component of the wiring by mounting a diode whose substrate rear surface side is determined as a cathode, on the same semiconductor layer as the lateral MOSFET and forming in the semiconductor layer the wiring which connects the cathode and a source of the MOSFET.

Embodiments according to the present invention will now be described hereinafter with reference to the drawings.

<First Embodiment>

Figure 3:
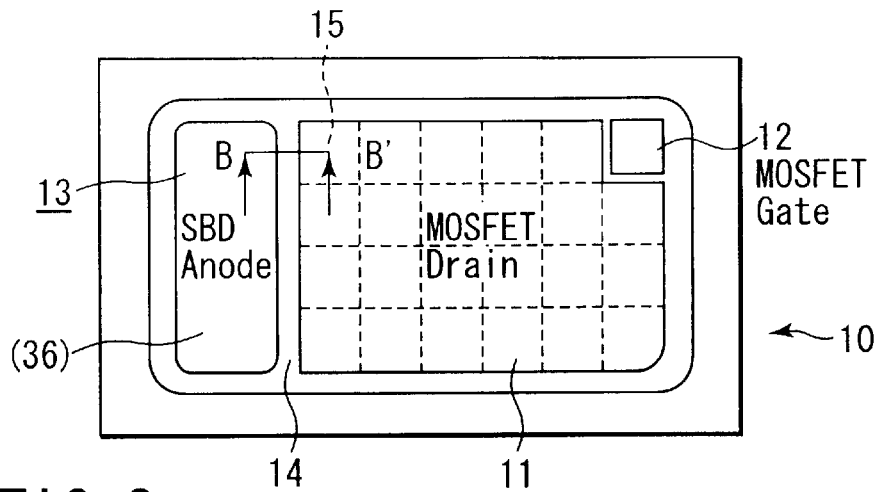
FIG. 3 is a top plan view showing a pattern layout of a semiconductor device according to first to fourth embodiments according to the present invention.

FIG. 3 is a top plan view showing an example of a pattern layout of a semiconductor device according to a first embodiment of the present invention.

This semiconductor device has a MOSFET and an SBD formed on the same semiconductor substrate. Here, on a semiconductor chip 10 are selectively formed a surface drain electrode 11 of the MOSFET, a surface gate electrode 12 of the MOSFET and an anode electrode 36 of the SBD, and the MOSFET and the SBD are separated by an insulator (for example, a silicon oxide film) 14.

Figure 4:
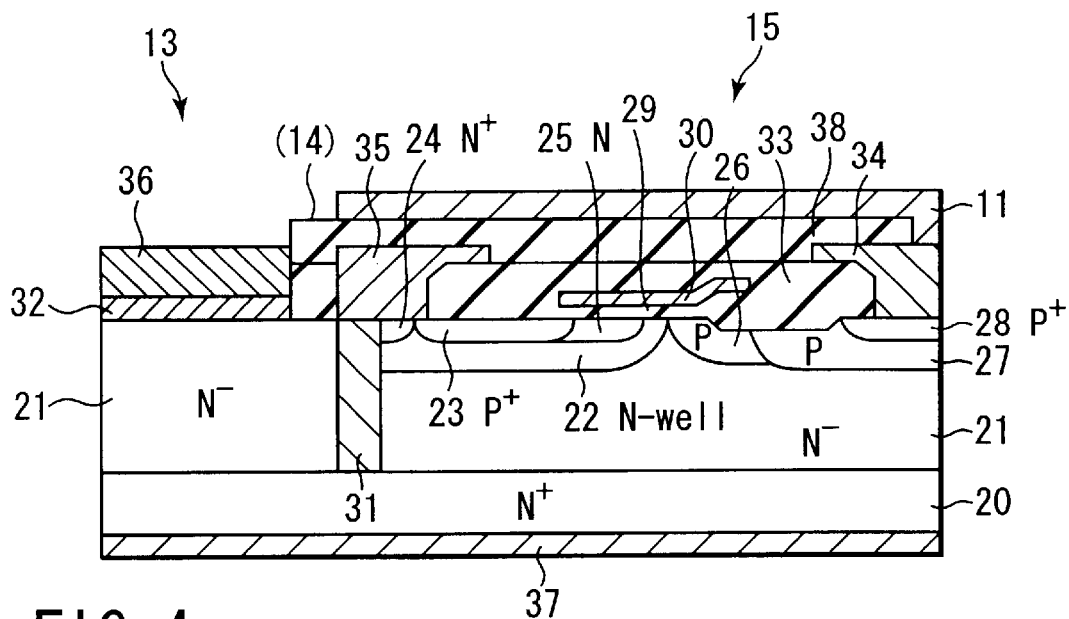
FIG. 4 is a cross-sectional view of a semiconductor device according to the first embodiment taken along the line B-B' in FIG. 3 and schematically shows one cell of a PMOSFET having a double diffusion type lateral structure and a structure of an SBD formed on an $N^+/N^-$ substrate.

FIG. 4 schematically shows an example of a cross-sectional structure taken along the line B-B' in FIG. 3. Here, as an example, there are shown one cell 15 of a PMOSFET having a double diffusion type lateral structure and an SBD 13 formed on an N⁺/N⁻ substrate obtained by epitaxial growth of an N⁻ layer 21 on an N⁺ semiconductor substrate 20.

It is to be noted that the MOSFET has a plurality of the cells 15 shown in FIG. 4 formed in alignment as indicated by dotted lines in FIG. 3, and a surface drain electrode 11 common to a plurality of the cells is formed on the uppermost plane.

In FIG. 4, in an FET forming area, the PMOSFET having the double diffusion type lateral structure is selectively formed on the N⁻ layer 21. In this case, an N-well 22 is selectively formed on the surface layer portion of the N⁻ layer 21, and a P⁺ source area 23 and an N⁺ layer 24 (N-well electrode area) are selectively formed on the surface layer portion of this N-well 22. In addition, an N layer 25 is formed in a part of a channel area.

Additionally, a P layer 26 is selectively formed on the surface layer portion of the N⁻ layer 21 adjacent to a channel area of the N-well 22, and a P layer 27 having a different impurity concentration is selectively formed adjacent to this P layer 26. Further, a P⁺ drain area 28 is selectively formed on the surface layer portion of this P layer 27. Here, there exists a parasitic diode obtained by the PN junction between the P layers 26 and 27 and the N⁻ layer 21.

Furthermore, an internal gate electrode 30 made of, e.g., polysilicon is formed on the channel area of the surface layer portion of the N-well 22 through a gate insulator 29.

Moreover, a trench having a depth reaching the N⁺ substrate 20 from the surface of the N-well 22 through the N⁻ layer 21 is formed, and a conductive portion 31 which electrically connects the N-well 22 with the N⁺ substrate 20 is formed in this trench. This conductive portion 31 is formed by embedding an electrode material (for example, metal or low-resistance polysilicon) having the low resistance in a contact hole. Alternatively, the conductive portion 31 may be formed of a silicon layer which is of the same conductive type as the N⁺ substrate 20 and has a high impurity concentration.

On the other hand, in the SBD forming area on, e.g., one end side of the semiconductor chip plane, a barrier metal 32 is formed on the surface of the N⁻ layer 21.

Furthermore, a first interlayer insulator 33 is deposited on the entire plane of the substrate, and a plurality of contact holes are opened at predetermined positions of the first interlayer insulator 33. On the first interlayer insulator 33 are formed an internal drain electrode 34 formed of metal which contacts the P⁺ drain area 28 through one of the contact holes, and an internal source electrode 35 formed of metal which contacts the P⁺ source area 23, the N⁺ layer 24 (N-well electrode area) and the conductive portion 31 through another contact hole.

Moreover, a second interlayer insulator 38 is deposited on the entire plane of the substrate, and a plurality of contact holes are opened at predetermined positions of the second interlayer insulator 38. On the second interlayer insulator 38 is formed a surface drain electrode 11 formed of metal which contacts the internal drain electrode 34 through one of the contact holes.

The internal gate electrode 30 is connected to the surface gate electrode 12 (FIG. 3) through a non-illustrated gate wiring.

In the SBD area, an anode electrode 36 made of metal is formed so as to contact the barrier metal 32 through one of the contact holes.

Therefore, the first interlayer insulator 33 and the second interlayer insulator 38 insulate and separate the surface drain electrode 34, the internal gate electrode 30, the internal source electrode 35 and the anode electrode 36.

In addition, on a rear surface of the N⁺ substrate, a source/cathode electrode 37 is commonly formed as a source electrode of the PMOSFET and a cathode electrode of the SBD.

Figure 5:
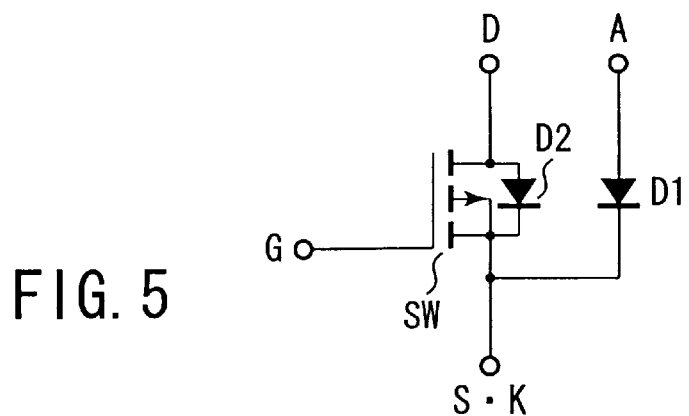
FIG. 5 is an equivalent circuit diagram showing the semiconductor device of FIG. 4.

FIG. 5 shows an equivalent circuit of the semiconductor device of FIG. 4.

Here, a reference symbol SW denotes a PMOSFET; D1, an SBD; D2, a parasitic diode of the PMOSFET; D, a drain terminal; G, a gate terminal; A, an anode terminal; and S·K, a source/cathode terminal. This semiconductor device is used for, e.g., a direct-current switch explained in connection with FIG. 1 or a DC—DC converter described with reference to FIG. 2.

Figure 1:
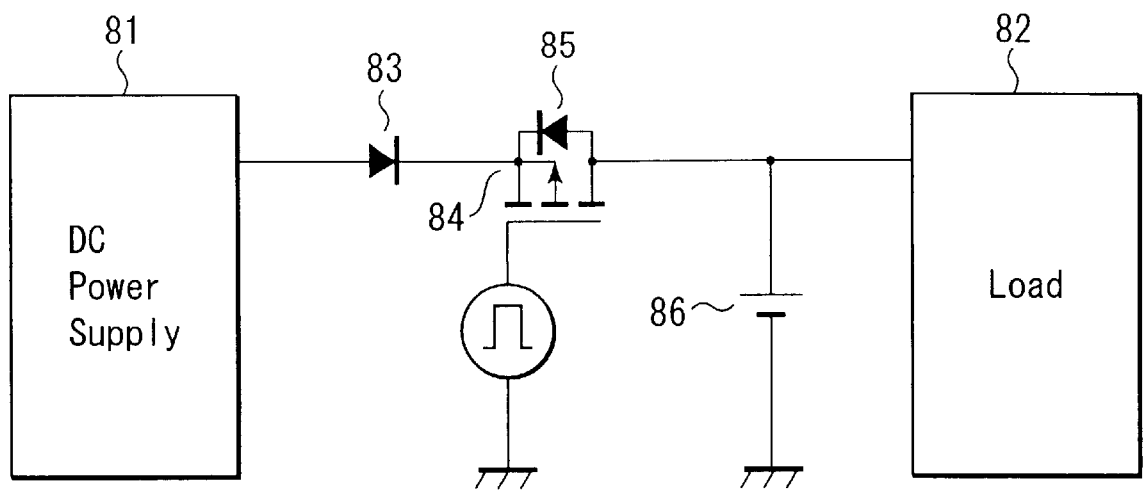
FIG. 1 is a view showing a prior art circuit connection as an example of use of a direct-current switch constituted by connecting a P-channel type power MOSFET and a reverse current preventing SBD in series.
Figure 2:
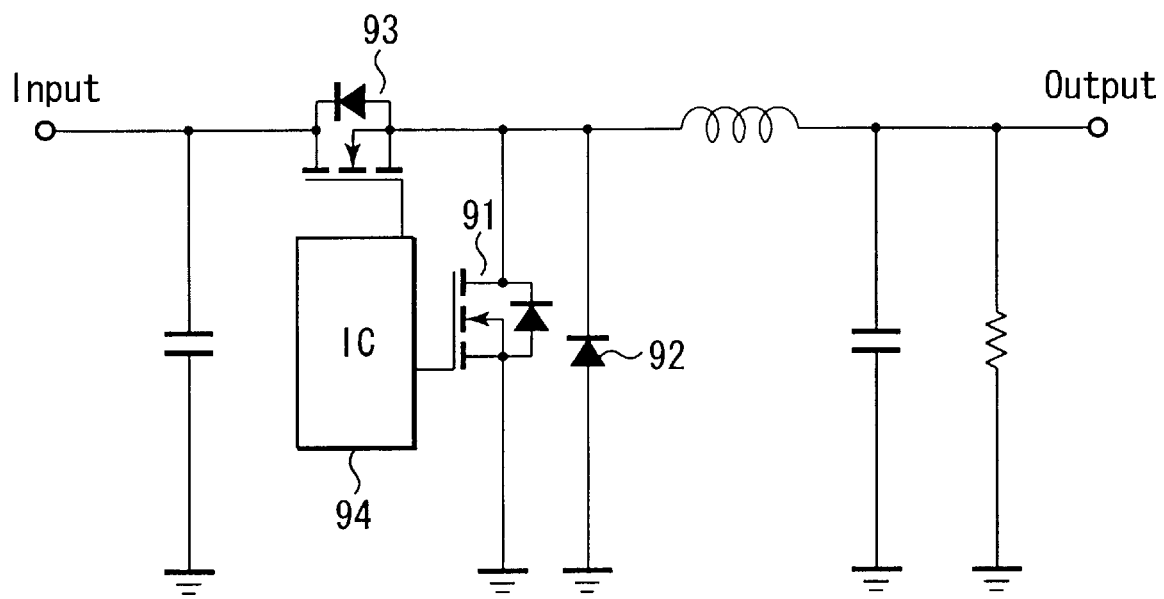
FIG. 2 is a view showing a prior art circuit connection of a synchronous rectification type DC—DC converter constituted by an N-channel type power MOSFET and SBD for return current.

The operation of the semiconductor device having the above-described structure will now be briefly explained. The PMOSFET having the double diffusion type lateral structure can control to turn on/off a source current which flows from the source electrode 37 of the PMOSFET to the surface drain electrode 11 by using a control voltage applied to the surface gate electrode 12 (its operation principle is well known, thereby omitting explanation). Additionally, for example, in case of applying this semiconductor device to such a direct-current switch as shown in FIG. 1, when the reverse current is about to flow from the drain D to the anode A through the parasitic diode D2 in the OFF state of the PMOSFET, the reverse current is avoided by the SBD (D1).

According to the semiconductor device of the first embodiment, the source area 23 of the PMOSFET and the cathode area of the SBD ($N^+$ substrate 20) are internally connected to each other by the conductive portion 31, and the source/cathode electrode 37 commonly used as the source electrode of the MOSFET and the cathode electrode of the SBD is formed on the rear surface. Furthermore, the surface drain electrode 11 of the MOSFET and the surface anode electrode of the SBD are formed on the same semiconductor chip in the insulated and separated state.

Therefore, the source area 23 of the PMOSFET and the cathode area of the SBD do not have to be connected through external wirings, thereby reducing the cost, the packaging area, and the resistance component or the inductance component of the wirings.

<Second Embodiment>

The semiconductor device according to a second embodiment has a pattern layout shown in FIG. 3 and has an NMOSFET with the double diffusion type lateral structure and an SBD formed on the $P^+/P^-$ substrate.

Figure 6:
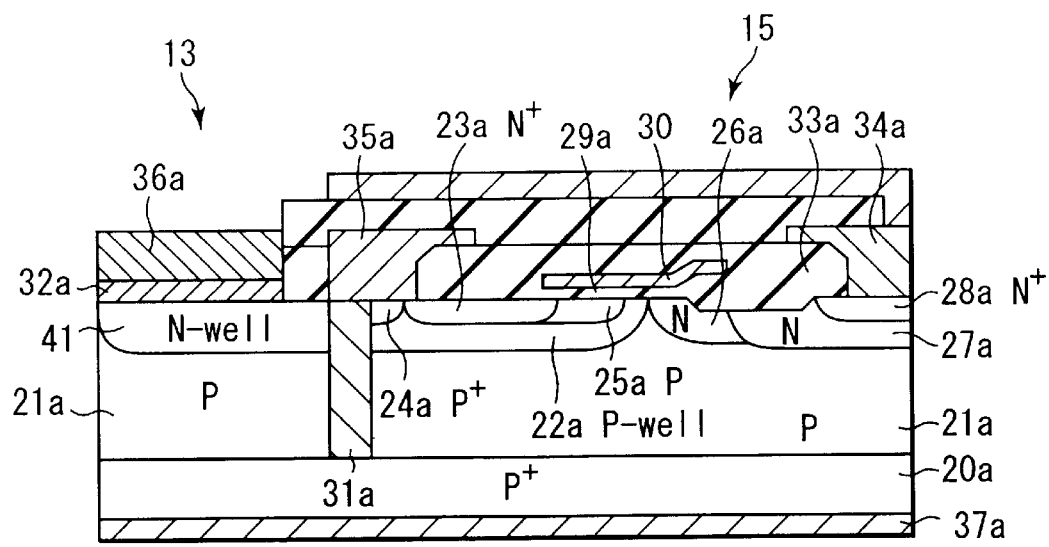
FIG. 6 is a cross-sectional view of the semiconductor device according to the second embodiment taken along the line B-B' in FIG. 3 and schematically shows one cell of an NMOSFET having a double diffusion type lateral structure and a structure of an SBD formed on a $P^+/P^-$ substrate.

FIG. 6 schematically shows a cross-sectional structure of one cell 15 of the NMOSFET and the SBD 13 taken along the line B-B' in FIG. 3.

This semiconductor device is different from the semiconductor device according to the first embodiment described in conjunction with FIG. 4 in that the P conductive type and N conductive type of the semiconductor are counterchanged, an N-well 41 is formed on the surface layer portion of a $P^-$ layer 21a in the SBD forming area and a barrier metal 32a is formed on the surface of this N-well 41. Any other structure remains unchanged. Therefore, reference numerals with a in FIG. 6 denote parts corresponding to those in FIG. 4, thereby omitting their explanation.

Since the operation of this semiconductor device is basically the same as that of the semiconductor device according to the first embodiment, thereby omitting the detailed description.

<Third Embodiment>

The semiconductor device according to a third embodiment has a pattern layout shown in FIG. 3, and has a PMOSFET with an LDD structure and an SBD formed on the $N^+/N^-$ substrate.

Figure 7:
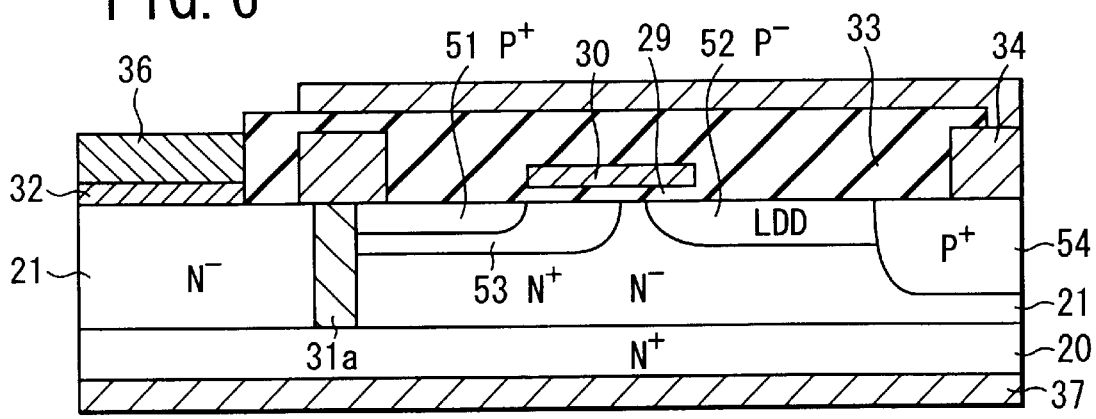
FIG. 7 is a cross-sectional view of the semiconductor device according to the third embodiment taken along the line B-B' in FIG. 3 and schematically shows an example of one cell of a PMOSFET having an LDD structure and a structure of an SBD formed on the $N^+/N^-$ substrate.

FIG. 7 schematically shows a cross-sectional structure of one cell 15 of the PMOSFET and the SBD 13 taken along the line B-B' in FIG. 3.

This semiconductor device is different from the counterpart according to the first embodiment described in connection with FIG. 4 in that the PMOSFET is changed from the lateral structure to the LDD structure (having a $P^+$ source area 51 with a shallow junction and an $N^+$ source area 53 with a deep junction, and a $P^-$ drain area 52 with a shallow junction and a $P^+$ drain area 54 with a deep junction), and any other structure remains unchanged.

Since the operation of this semiconductor device is basically the same as that of the semiconductor device according to the first embodiment, thereby omitting the detailed explanation.

<Fourth Embodiment>

The semiconductor device according to a fourth embodiment has a pattern layout shown in FIG. 3, and has an NMOSFET with the LDD structure and an SBD formed on the $P^+/P^-$ substrate.

Figure 8:
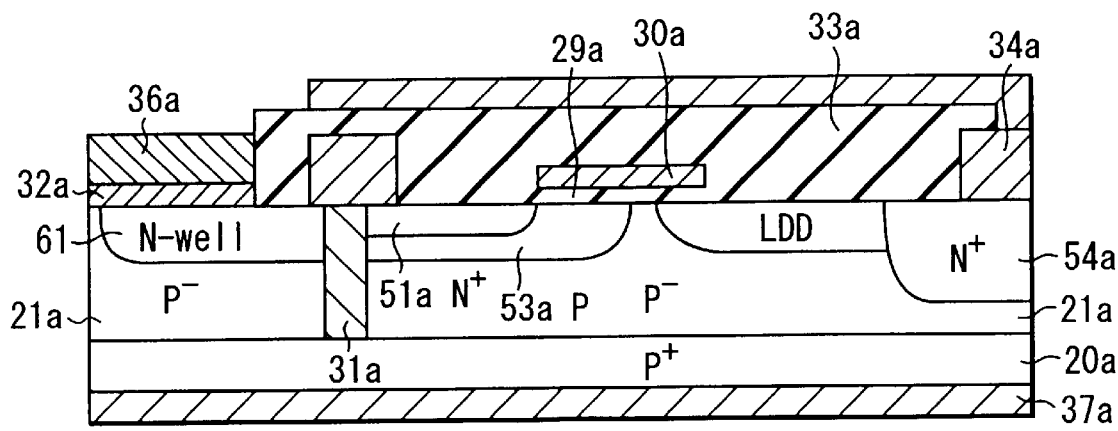
FIG. 8 is a cross-sectional view of the semiconductor device according to the fourth embodiment taken along the line B-B' in FIG. 3 and schematically shows an example of one cell of an NMOSFET having an LDD structure and a structure of an SBD formed on the $P^+/P^-$ substrate.

FIG. 8 schematically shows a cross-sectional structure of one cell 15 of the NMOSFET and an SBD 13 taken along the line B-B' in FIG. 3.

This semiconductor device is different from the semiconductor device according to the third embodiment described in conjunction with FIG. 7 in that the P conductive type and the N conductive type of the semiconductor are counterchanged, an N-well 61 is formed on the surface layer portion of the $P^-$ layer 21a in the SBD forming area and a barrier metal 32a is formed on the surface of this N-well 61. Since other structures are the same, a is added to each of the reference numerals in FIG. 8 and these reference numerals denote parts corresponding to those in FIG. 7, thereby omitting their explanation.

Since the operation of this semiconductor device is basically the same as that of the semiconductor device according to the first embodiment, a detailed description is omitted.

<Modifications of Pattern Layout>

FIGS. 9A to 9D are top plan views showing various modifications of the pattern layout of the semiconductor device in the first to fourth embodiments according to the present invention.

Figure 9A:
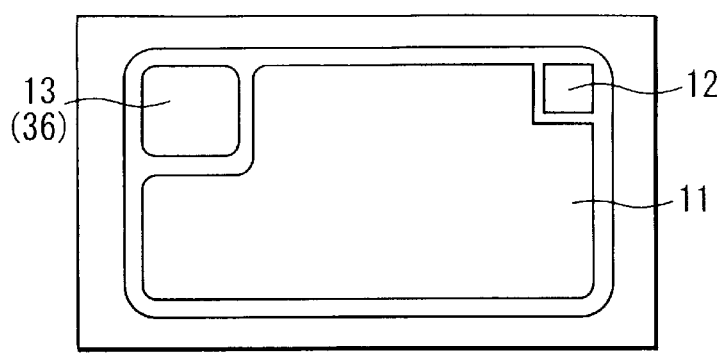
FIGS. 9A to 9D are top plan views showing various modifications of the pattern layout of the semiconductor device according to the first to fourth embodiments.

A pattern layout shown in FIG. 9A is different from the pattern layout shown in FIG. 3 in that an FET forming area (or a surface drain electrode 11) is enlarged to one side of an SBD forming area 13 and an area of the SBD forming area 13 (anode electrode 36) is reduced to approximately ½, and any other structures remain unchanged. Even if the size of the SBD 13 is small in this manner, there is no problem as long as a desired performance can be obtained.

Figure 9B:
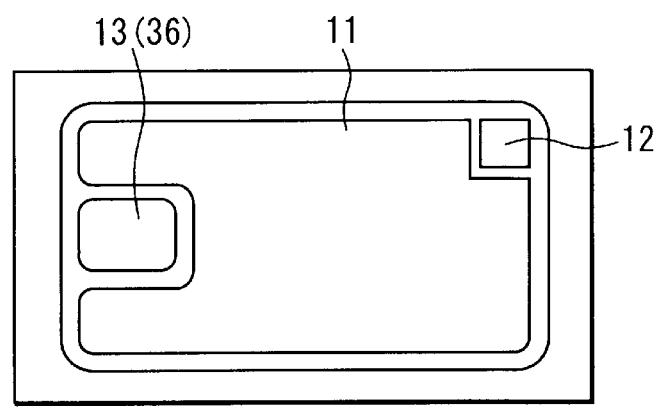

A pattern layout shown in FIG. 9B is different from that illustrated in FIG. 3 in that the FET forming area (or the surface drain electrode 11) is enlarged to both sides of the SBD forming area and an area of the SBD forming area 13 (anode electrode 36) is reduced to approximately ⅓, and the other structures remain unchanged. Even if the size of the SBD is small in this manner, there is no problem as long as a desired performance can be obtained.

Figure 9C:
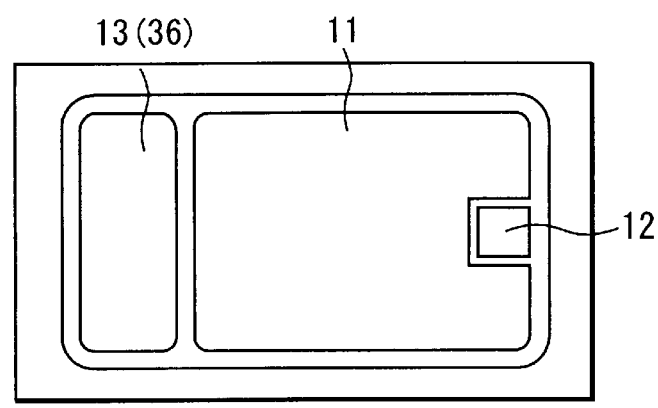

A pattern layout shown in FIG. 9C is different from that illustrated in FIG. 3 in that a position of the surface gate electrode 12 is moved to a central part on one end side of the FET forming area, and the balance of a distance from the internal gate electrode (30 in FIG. 4) of each FET cell to the surface gate electrode 12 is thereby improved.

Figure 9D:
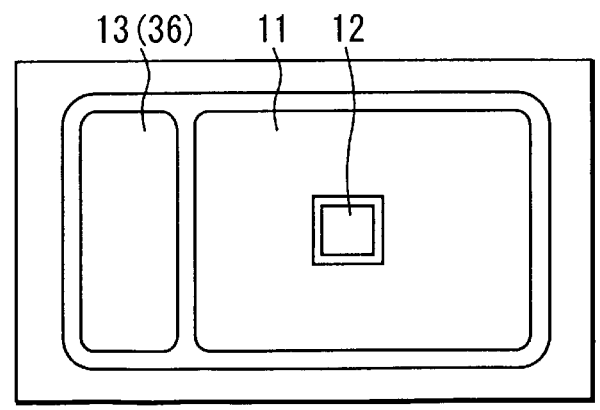
Figure 10A:
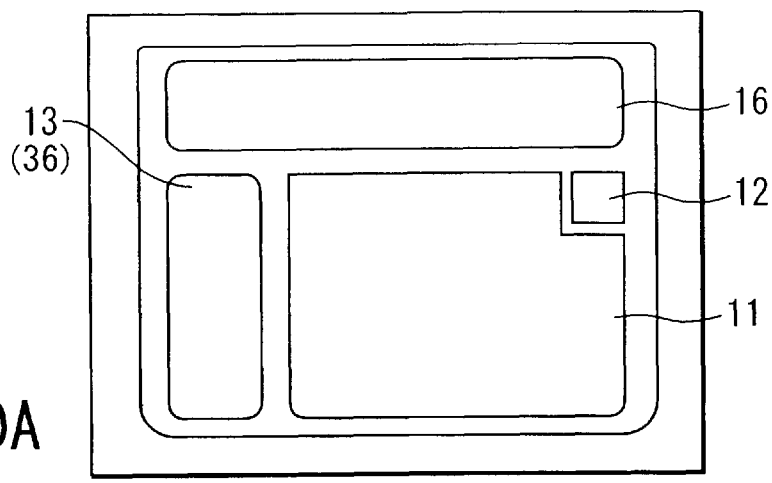
FIGS. 10A to 10E are top plan views showing other modifications of the pattern layout of the semiconductor device according to the first to fourth embodiments.
Figure 10B:
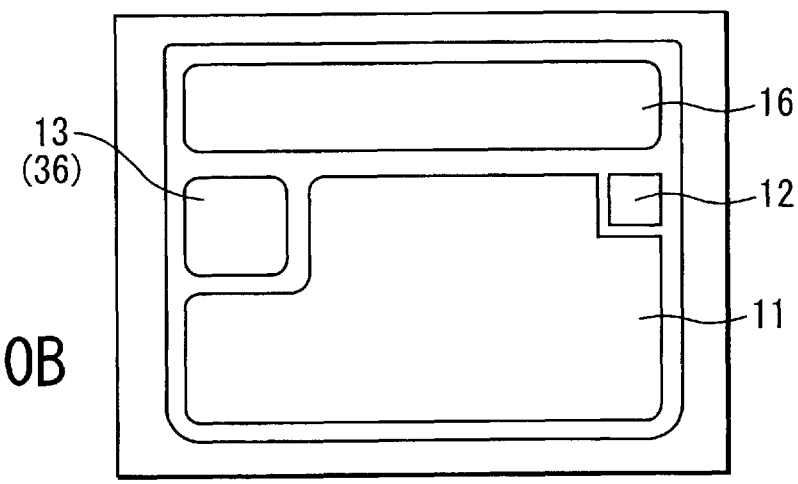
Figure 10C:
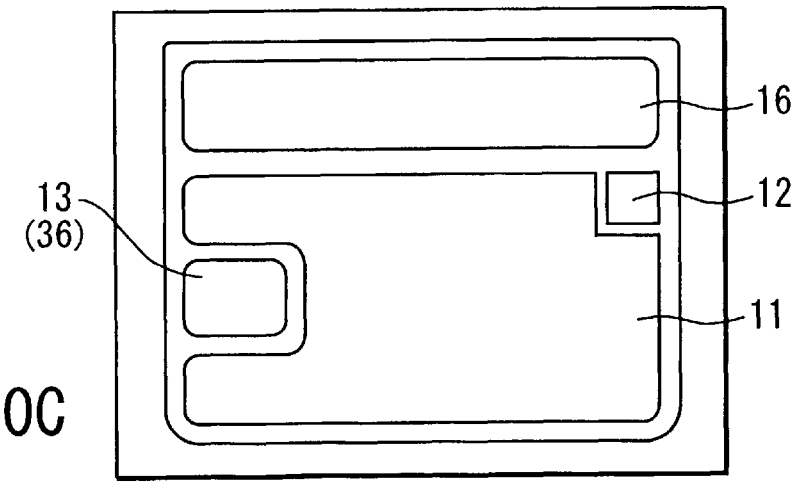
Figure 10D:
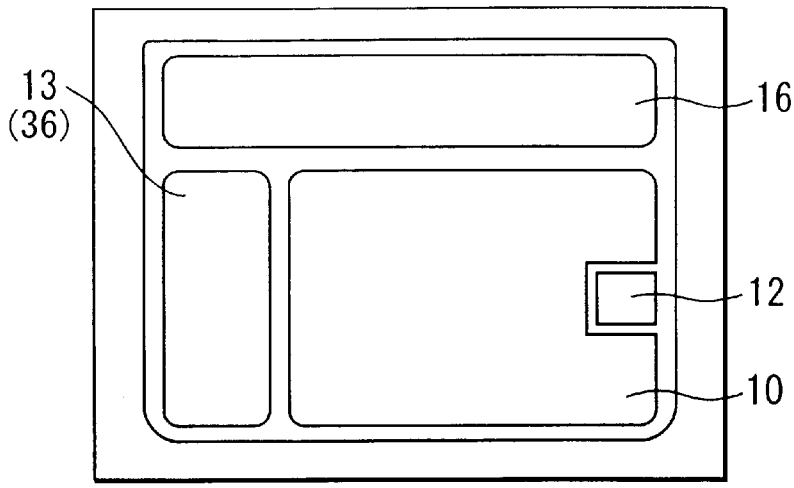
Figure 10E:
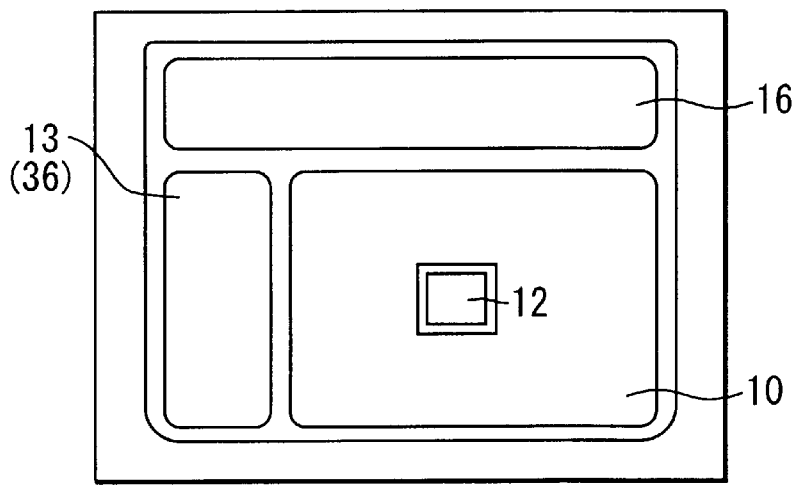

A pattern layout shown in FIG. 9D is different from that illustrated in FIG. 3 in that a position of the surface gate electrode 12 is moved to a central part of the FET forming area, and the balance of a distance from the internal gate electrode (30 in FIG. 4) of each FET to the surface gate electrode 12 is further improved.

Additionally, FIGS. 10A to 10E are views showing pattern layout examples of the semiconductor device, in which an IC 16 such as a drive IC is added to the above-described semiconductor device.

<Fifth Embodiment>

Although there have been illustrated examples of forming the SBD as a single element in the first to fourth embodiments, SBDs may be formed as a plurality of unit elements similar to the MOSFETs, and they may be respectively formed beside a plurality of unit elements of MOSFETs. The fifth embodiment is such an example.

FIG. 11 is a plan view of the semiconductor device according to the fifth embodiment. On the surface of the semiconductor device are formed a surface drain electrode 11, a surface gate electrode 12 and a surface anode electrode 17. As indicated by dotted lines, a plurality of MOSFETs 15 and a plurality of SBD 13a are formed on the lower part of the surface drain electrode 11 adjacent to each other.

Figure 12:
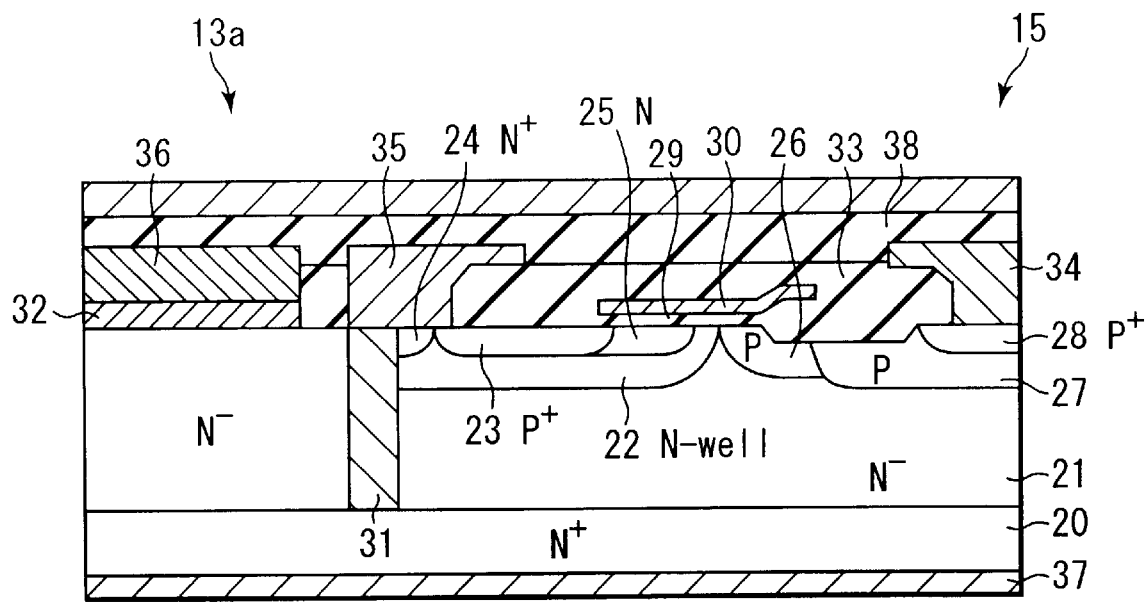
FIG. 12 is a cross-sectional view of the semiconductor device according to a fifth embodiment taken along the line C-C' in FIG. 11 and schematically shows one cell of a PMOSFET having a double diffusion type lateral structure and a structure of an SBD formed on an N⁺/N⁻ substrate.

FIG. 12 is a cross-sectional view taken along the line C-C' in FIG. 11. Although it is basically the same as the cross-sectional structure according to the first embodiment, the anode electrode 36 of the SBD 13a is not exposed to the surface of the device but connected to the surface anode electrode 17 commonly provided for a plurality of the SBDs 13a through non-illustrated internal wirings.

Determining the arrangement of the MOSFETs 15 and the SBDs 13a in accordance with a circuit specification or the like can suffice. As shown in FIG. 13A, the anode electrode 36 of each SBD 13a may be arranged so as to be sandwiched between the internal source electrodes 35 of the MOSFETs 15. Alternatively, as shown in FIG. 13B, the anode electrode 36 of each SBD 13a may be arranged between the internal source electrode 35 and the internal drain electrode 34 of the MOSFET 15. Further, the planar arrangement of the MOSFETs and the SBDs is not restricted to that illustrated in FIG. 11.

Furthermore, the structure of the MOSFET can take such structures as illustrated in the second to fourth embodiments. Moreover, such drive IC circuits as shown in FIGS. 10A to 10E can be also provided.

It is to be noted that the SBD may be replaced with a regular diode in the first to fifth embodiments. In this case, in the semiconductor devices shown in FIGS. 4 and 7, it is good enough to eliminate the barrier metal 32 and a P-well 38 is selectively formed in the diode forming area of the N⁻ layer surface layer portion in such a manner that the P-well 38 is separated from the conductive portion 31 (see FIG. 14).

Incidentally, although description has been given as to the case that the conductive portion to which the internal source electrode and the source/cathode electrode are electrically connected has a trench type via structure in each of the foregoing embodiments, the conductive portion may be constituted by an impurity diffusion layer.

In addition, it is possible to employ the MISFET which uses as the gate insulator any other insulator, such as a silicon nitride film or a tantalum oxide film, as well as a silicon oxide film.

As described above, according to the semiconductor device according to the present invention, the source electrode of the FET and the cathode electrode of the diode are realized as one common electrode, the drain electrode of the FET and the anode electrode of the diode are mounted on the same semiconductor chip in the insulated and separated state, and the source area of the FET and the cathode of the diode do not have to be connected through external wirings, thereby reducing the cost, the packaging area, and the resistance component or the inductance component of the wirings.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first conductivity type semiconductor substrate having a first and a second main plane;
   a first conductivity type semiconductor layer formed on said first main plane of said semiconductor substrate;
   a MISFET formed in a first surface area of said semiconductor layer, said MISFET having a drain region and a source region selectively formed on said semiconductor layer, and a gate electrode formed on said semiconductor layer between said drain region and said source region through a gate insulator;
   an internal source electrode formed so as to contact said source region on a top of said semiconductor layer and whose surface is covered with an insulating layer;
   a diode formed in a second surface area of said semiconductor layer, said diode having a cathode region provided in said semiconductor layer and an anode region provided on said cathode region;
   an anode electrode formed above said semiconductor layer and contacts said anode region of said diode;
   a conductive portion which pierces said semiconductor layer so as to electrically connect said internal source electrode of said MISFET and said cathode region of said diode; and
   a source/cathode electrode formed on said second main plane of said semiconductor substrate and commonly provided as a source electrode of said MISFET and a cathode electrode of said diode.

2. The semiconductor device according to claim 1, wherein said semiconductor layer is of an N type, and said diode is a Schottky barrier diode having said N type semiconductor layer, a barrier metal formed on said semiconductor layer and said anode electrode which contacts said barrier metal.

3. The semiconductor device according to claim 1, wherein said semiconductor layer is of a P type, and said diode is a Schottky barrier diode having an N type layer selectively formed on said P type semiconductor layer, a barrier metal formed on said N type layer, and said anode electrode formed on said barrier metal.

4. The semiconductor device according to claim 1, wherein said MISFET is formed by connecting a plurality of double diffusion type lateral MISFET cells in parallel.

5. The semiconductor device according to claim 1, wherein said MISFET is formed by connecting a plurality of PMISFET cells formed on said semiconductor layer which is of the N type in parallel.

6. The semiconductor device according to claim 1, wherein said MISFET is formed by connecting a plurality of NMISFET cells formed on said semiconductor layer which is of the P type in parallel.

7. The semiconductor device according to claim 1, wherein said conductive portion includes anyone of metal and low-resistance polysilicon embedded in a trench formed in said semiconductor layer.

8. The semiconductor device according to claim 1, wherein said conductive portion is formed of said first conductivity type semiconductor layer with a high impurity concentration.

9. A semiconductor device comprising:
   a first conductivity type semiconductor substrate having a first and a second main plane;

a first conductivity type semiconductor layer formed on said first main plane of said semiconductor substrate;

a plurality of MISFETs formed in a first surface area of said semiconductor layer, each of said plurality of MISFETs having a drain region and a source region selectively formed on said semiconductor layer, and a gate electrode formed on said semiconductor layer between said drain region and said source region through a gate insulator;

an internal drain electrode formed so as to contact said drain region on said semiconductor layer;

an internal source electrode formed so as to contact said source region on said semiconductor layer;

a diode formed in a second surface area of said semiconductor layer, said diode having a cathode region provided in said semiconductor layer and an anode region provided on said cathode region;

an anode electrode formed above said semiconductor layer and contacts said anode region of said diode;

an interlayer insulator formed on said first semiconductor layer so as to cover said first surface area and said second surface area while exposing said anode electrode;

a surface drain electrode formed on said interlayer insulator above said first surface area and connected to said internal drain electrode of each of said plurality of MISFETs;

a conductive portion which pierces said semiconductor layer so as to electrically connect said internal source electrode of said MISFET and said cathode region of said diode to said semiconductor substrate; and a source/cathode electrode formed on said second main plane of said semiconductor substrate and commonly provided as a source electrode of said plurality of MISFETs and a cathode electrode of said diode.

10. The semiconductor device according to claim 9, wherein said semiconductor layer is of an N type, and said diode is a Schottky barrier diode having said N type semiconductor layer, a barrier metal formed on said semiconductor layer and said anode electrode which contacts said barrier metal.

11. The semiconductor device according to claim 9, wherein said semiconductor layer is of a P type, and said diode is a Schottky barrier diode having an N type layer selectively formed on said P type semiconductor layer, a barrier metal formed on said N type layer and said anode electrode formed on said barrier metal.

12. The semiconductor device according to claim 9, wherein said plurality of MISFETs are formed by connecting a plurality of double diffusion type lateral MISFET cells in parallel.

13. The semiconductor device according to claim 9, wherein said conductive portion is formed of anyone of metal and low-resistance polysilicon embedded in a plurality of trenches formed in said semiconductor layer.

14. The semiconductor device according to claim 9, wherein said conductive portion is formed of said first conductivity type semiconductor layer with a high impurity concentration.

15. A semiconductor device comprising:

a first conductivity type semiconductor substrate having a first and a second main plane;

a first conductivity type semiconductor layer formed on said first main plane of said semiconductor substrate;

a plurality of MISFETs formed in said semiconductor layer, each of said plurality of MISFETs having a drain region and a source region selectively formed on said semiconductor layer, and a gate electrode formed on said semiconductor layer between said drain region and said source region through a gate insulator;

an internal drain electrode formed so as to contact said drain region on said semiconductor layer;

an internal source electrode formed so as to contact said source region on said semiconductor layer;

a plurality of diodes formed in areas between said plurality of MISFETs on said semiconductor layer, each of said plurality of diodes having a cathode region provided in said semiconductor layer and an anode region provided on said cathode region;

a plurality of internal anode electrodes formed above said semiconductor layer and contact said anode region of each of said plurality of diodes;

an interlayer insulator formed on said first semiconductor layer;

a surface drain electrode formed on said interlayer insulator and connected to said internal drain electrode of each of said plurality of MISFETs;

a surface anode electrode formed on said interlayer insulator and connected to said plurality of internal anode electrodes;

a plurality of conductive portions which pierce said semiconductor layer so as to electrically connect said internal source electrode of each of said plurality of MISFETs and said cathode region of each of said plurality of diodes to said semiconductor substrate; and a source/cathode electrode formed on said second main plane of said semiconductor substrate and commonly provided as a source electrode of a plurality of said MISFETs and a cathode electrode of a plurality of said diodes.

16. The semiconductor device according to claim 15, wherein said semiconductor layer is of an N type, and each of said plurality of diodes is a Schottky diode having said N type semiconductor layer, a barrier metal formed on said semiconductor layer and said anode electrode which contacts said barrier metal.

17. The semiconductor device according to claim 15, wherein said semiconductor layer is of a P type, and each of said plurality of diodes is a Schottky barrier diode having an N type layer selectively formed on said P type semiconductor layer, a barrier metal formed on said N type layer and said anode electrode formed on said barrier metal.

18. The semiconductor device according to claim 15, wherein said plurality of MISFETs are formed by connecting a plurality of double diffusion type lateral MISFET cells in parallel.

19. The semiconductor device according to claim 15, wherein each of said plurality of conductive portions are made of anyone of metal and low-resistance polysilicon embedded in a plurality of trenches formed in said semiconductor layer.

20. The semiconductor device according to claim 15, wherein each of said plurality of conductive portions is formed of said first conductivity type semiconductor layer with a high impurity concentration.

* * * * *